United States Patent
Tamanuki (10) Patent No.: US 9,368,937 B1
(45) Date of Patent: Jun. 14, 2016

(54) MULTIMODE VERTICAL CAVITY SURFACE EMITTING LASER HAVING NARROW LASER LIGHT EMITTING ANGLE

(71) Applicant: SAE Magnetics (H.K.) Ltd., Hong Kong (CN)

(72) Inventor: Takemasa Tamanuki, Hong Kong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 540 days.

(21) Appl. No.: 13/967,801

(22) Filed: Aug. 15, 2013

(30) Foreign Application Priority Data

Mar. 29, 2013 (CN) .......................... 2013 1 0109611

(51) Int. Cl.
*H01S 5/125* (2006.01)
*H01S 5/187* (2006.01)
*H01S 5/183* (2006.01)
*H01S 5/028* (2006.01)

(52) U.S. Cl.
CPC ................. *H01S 5/125* (2013.01); *H01S 5/028* (2013.01); *H01S 5/0282* (2013.01); *H01S 5/183* (2013.01); *H01S 5/187* (2013.01); *H01S 5/18327* (2013.01); *H01S 5/18344* (2013.01); *H01S 5/18377* (2013.01)

(58) Field of Classification Search
CPC ..... H01S 5/028; H01S 5/0282; H01S 5/0653; H01S 5/125; H01S 5/183; H01S 5/18327; H01S 5/18344; H01S 5/18377; H01S 5/187
See application file for complete search history.

(56) References Cited

U.S. PATENT DOCUMENTS

2007/0153861 A1   7/2007   Collins et al.
2007/0217472 A1   9/2007   Collins et al.

OTHER PUBLICATIONS

Sun et al., "Advanced Multimode Fiber for High Speed, Short Reach Interconnect", Proc. of SPIE, vol. 7134, 71341L, 2008, 15 pages.

*Primary Examiner* — Armando Rodriguez
(74) *Attorney, Agent, or Firm* — Nixon & Vanderhye PC (57) ABSTRACT

The top high refractive index layer of the top DBR mirror has a central region and a peripheral region. The central region has a protrusion that projects relative to the peripheral region in a direction in which the laser light is emitted. The VCSEL satisfies relationships below:

$$dp \times n = (1/4 + N/2) \times \lambda, \text{ and}$$

$$dc \times n = dp \times n + (1/4 + M/2) \times \lambda$$

where
$\lambda$ is a wavelength of the laser light in vacuum;
$dc$ is a film thickness of the top high refractive index layer in the central region;
$dp$ is a film thickness of the top high refractive index layer in the peripheral region;
$n$ is a refractive index of the top high refractive index layer; and
N and M are zero or a natural number.

5 Claims, 9 Drawing Sheets

Diameter of Top High Refractive Index Layer in Central Region (μm)

MULTIMODE VERTICAL CAVITY SURFACE EMITTING LASER HAVING NARROW LASER LIGHT EMITTING ANGLE

This application claims priority to Chinese Application No. 201310109611.5 filed Mar. 29, 2013, the entire contents of which is hereby incorporated by reference.

BACKGROUND OF THE INVENTION

1. Field of the Invention

The present invention relates to a vertical cavity surface emitting laser (VCSEL), and more particularly relates to a VCSEL that involves mode control.

2. Description of the Related Art

In short-distance optical fiber communication, transmission at a rate of 10 Gb/s over a distance of about 100 m has been achieved on a practical level by means of a VCSEL, working as a laser light source, and a multimode optical fiber, working as a transmission path.

Multimode (transverse mode) laser light emitted from a VCSEL propagates in a multimode optical fiber while it couples with corresponding eigenmodes of the multimode optical fiber. Since propagation velocity varies depending on the eigenmodes, the signal waveform that is received may be deteriorated. The characteristic of the VCSEL that causes the propagation velocity of laser light to vary depending on the eigenmodes is called "mode dispersion characteristic". When multimode optical fibers are used, the transmission performance (velocity and distance) in short-distance optical fiber communication is limited by the "mode dispersion characteristic" of the VCSEL.

In order to reduce the mode dispersion and thereby improve the transmission performance, it is necessary to reduce the difference among the propagation delays, which correspond to the respective modes of light propagating in the optical fiber. In order to reduce the above difference, it is desirable to determine the light propagation mode such that the difference between the maximum propagation delay and the minimum propagation delay is minimized. US2007/0153861 discloses a VCSEL having a protrusion, called a mirror extension, provided in the center of the upper mirror stack layer. Such a protrusion increases the reflectance ratio of the upper mirror stack layer so that the central region, provided with the protrusion, has a higher reflectance ratio than the peripheral region. As a result, low order modes having high electric field intensity in the central region oscillate more easily than high order modes that have high electric field intensity in the peripheral region.

Figure 1:
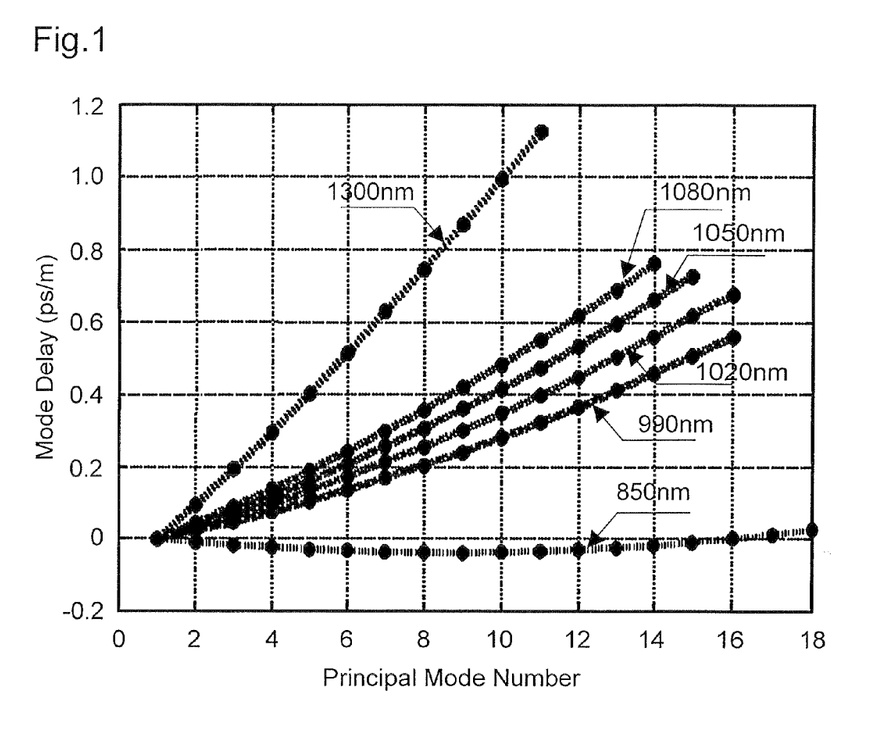
FIG. 1 is a graph showing the relationship between eigenmodes and propagation delays.

However, it is desirable to limit the oscillation of the fundamental mode or lower modes and to promote the oscillation of higher modes in order to obtain desirable results for various oscillation wavelengths. For example, in "Advanced multimode fiber for high velocity, short reach interconnect," Proc. of SPIE Vol. 7134, 71341 L-1, 2008, FIG. 2 (see FIG. 1), Y. Sun, R. Lingle, G. Oulundsen, A. H. McCurdy, D. S. Vaidya, D. Mazzarese and T. Irujo show the relationship between eigenmodes and propagation delays (mode delays) for various oscillation wavelengths. In the case where the wavelength is 850 nm, the propagation delay for the 1st to 9th order eigenmodes decreases as the order increases and the propagation delay for eigenmodes higher than the 9th order increases as the order increases. In the case where the wavelengths are longer than 850 nm (990 nm, 1300 nm), the propagation delay monotonously increases as the order increases. Therefore, in the case where the wavelength is 850 nm, for instance, the difference between the maximum propagation delay and the minimum propagation delay can be reduced (the mode dispersion can be reduced) by causing light to propagate with 7th to 10th eigenmodes, as compared with a case where light propagates with the first to tenth modes. In other words, the mode dispersion can be reduced by limiting the oscillation of the lower modes of the 1st to 6th orders and by promoting the oscillation of higher modes. The difference between the maximum propagation delay and the minimum propagation delay can also be reduced (the mode dispersion can be reduced) for wavelengths longer than 850 nm by causing light to propagate in the same manner, as compared with a case where light propagates with the first to tenth modes.

US2007/0217472 discloses a VCSEL having a recess in the center of a distributed Bragg reflecting mirror (DBR) on the light emitting side. The recess overlaps the active layer. The central region of the DBR mirror has a smaller number of stacked mirror layers so that it has a lower reflectance ratio than the peripheral region. Due to such a structure, higher modes having high electric field intensity in the peripheral region oscillate more easily than lower modes having high electric field intensity in the central region.

However, the recessed structure of the DBR mirror on the light emitting side allows laser light to be emitted from the VCSEL with a large emitting angle according to the principle of a lens (concave lens), causes the light to be diffused and increases a loss in coupling with an optical fiber.

An object of the present invention is to provide a VCSEL that limits both the oscillation of lower modes and the angle at which laser light is emitted.

SUMMARY OF THE INVENTION

A vertical cavity surface emitting semiconductor laser according to the present invention comprises a bottom distributed Bragg reflecting mirror, a top distributed Bragg reflecting mirror and an active layer for generating laser light positioned between the bottom distributed Bragg reflecting mirror and the top distributed Bragg reflecting mirror, the laser light being emitted from the top distributed Bragg reflecting mirror. The top distributed Bragg reflecting mirror includes high refractive index layers and low refractive index layers that are alternately stacked. One of the high refractive index layers is a top high refractive index layer positioned at a laser light emitting surface of the top distributed Bragg reflecting mirror. The top high refractive index layer has a central region and a peripheral region. The central region includes a projected point located on the top high refractive index layer. The projected point is obtained by projecting a center point in the active layer onto the top distributed Bragg reflecting mirror in a direction in which layers of the top distributed Bragg reflecting mirror are stacked. The peripheral region is positioned around the central region. The central region has a protrusion that projects relative to the peripheral region in a direction in which the laser light is emitted. The VCSEL satisfies relations below:

$$dp \times n = (1/4 + N/2) \times \lambda, \text{ and}$$

$$dc \times n = dp \times n + (1/4 + M/2) \times \lambda.$$

where $\lambda$ is a wavelength of the laser light in vacuum;

dc is a film thickness of the top high refractive index layer in the central region;

dp is a film thickness of the top high refractive index layer in the peripheral region;

n is a refractive index of the top high refractive index layer; and

N and M are zero or a natural number dc×n and dp×n are called "optical thickness". The optical thickness dp×n of the peripheral region of the top high refractive index layer corresponds to 1/4, 3/4, 5/4, etc. of the wavelength of laser light and increases the reflectance ratio of the entire top distributed Bragg reflecting mirror. On the other hand, the optical thickness dc×n of the central region corresponds to 1/2, 1/1, 3/2, etc. of the wavelength of laser light and reduces the reflectance ratio of the entire top distributed Bragg reflecting mirror. As a result, higher modes having high electric field intensity in the peripheral region oscillate more easily than lower modes having high electric field intensity in the central region. Moreover, the central region, which has an optical thickness higher than that of the peripheral region by (1/4+M/2)×?, generates the effect of collecting light toward the center and thereby limits the angle at which laser light is emitted.

The above-described and other objects, features and advantages of the present invention will become apparent from the following detailed description of the present invention with reference to the accompanying drawings illustrating the present invention.

DETAILED DESCRIPTION OF THE PREFERRED EMBODIMENTS

A vertical cavity surface emitting semiconductor laser according to an embodiment of the present invention will be described with reference to the accompanying drawings.

Figure 2:
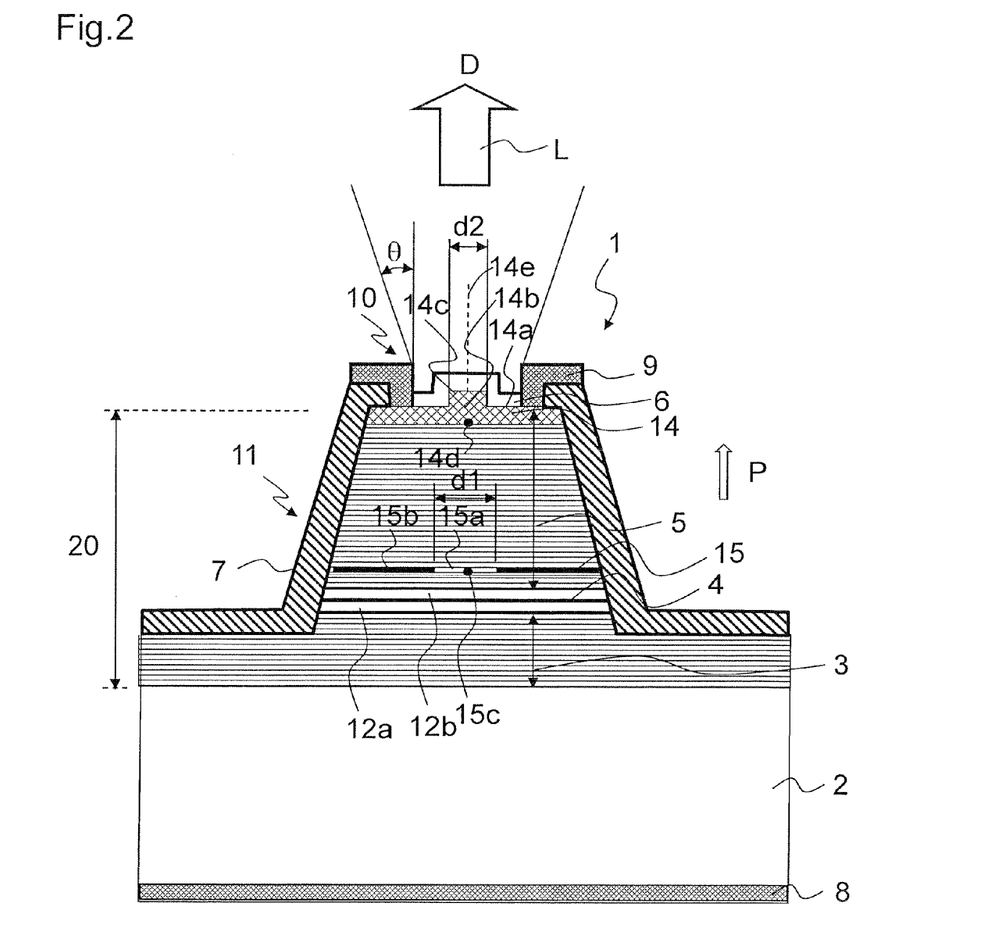
FIG. 2 is a sectional side view of a VCSEL according to an embodiment of the present invention.
Figure 3:
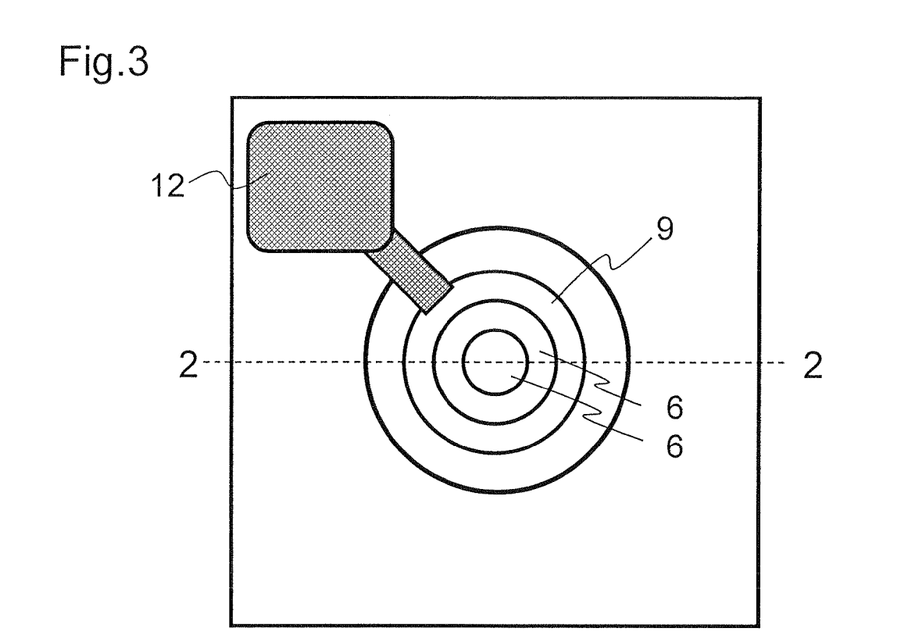
FIG. 3 is a plan view of the VCSEL shown in FIG. 2.

FIG. 2 is a sectional side view of vertical cavity surface emitting semiconductor laser (VCSEL) 1 according to an embodiment of the present invention. FIG. 3 is a plan view of VCSEL 1 shown in FIG. 2. FIG. 2 shows a sectional view taken along line 2-2 in FIG. 3. VCSEL 1 has substrate 2 and semiconductor multilayer film 20 that is provided on substrate 2. Semiconductor multilayer film 20 includes a pair of mirror stacks (bottom distributed Bragg reflecting mirror (bottom DBR mirror) 3, which is an n-type reflecting mirror, and top distributed Bragg reflecting mirror (top DBR mirror) 5, which is a p-type reflecting mirror) and active layer 4 that is positioned between bottom DBR mirror 3 and top DBR mirror 5. Active layer 4 generates laser light.

Substrate 2 may be formed of GaAs, InP and InGaAs, preferably with n-doping. Alternatively, non-doping or p-doping may also be used.

Figure 4:
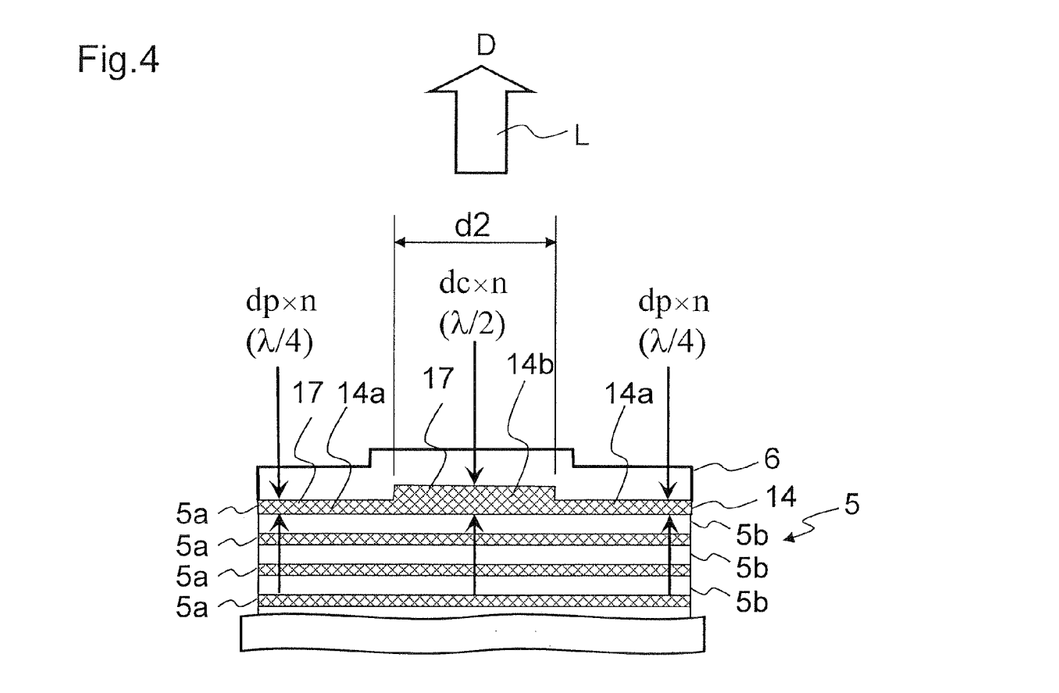
FIG. 4 is a sectional view schematically showing the configuration of the top DBR mirror.

Both bottom DBR mirror 3 and top DBR mirror 5 are stacks of layers in which high refractive index layers and low refractive index layers are alternately stacked. FIG. 4 shows high refractive index layers 5a and low refractive index layers 5b in top DBR mirror 5. Both high refractive index layers 5a and low refractive index layers 5b are formed of AlGaAs, but high refractive index layers 5a contain a smaller percentage of Al than low refractive index layers 5b. High refractive index layers 5a may contain zero percent of Al or may be formed of GaAs. The optical thicknesses of high refractive index layers 5a and low refractive index layers 5b are set at 1/4 of the laser light wavelength in vacuum, respectively. The optical thickness of a layer is defined as the product of the actual film thickness of the layer and the refractive index of the layer, as mentioned above. In the present embodiment, high refractive index layers 5a has a refractive index of about 3.5 and low refractive index layers 5b have a refractive index of about 2.9. The top layer of top DBR mirror 5, i.e., the layer that is in contact with protective film 6, described later, is top high refractive index layer 14. In other words, one of the layers from among high refractive index layers 5a is top high refractive index layer 14 positioned at laser light emitting surface 17 of top DBR mirror 5. Top high refractive index layer 14 has a protrusion that projects in direction D in which the laser light L is emitted, as described below.

Active layer 4 has a multiple quantum well structure in which well layers and barrier layers (both not shown) are alternately stacked. Table 1 shows exemplary combinations of the well layer and the barrier layer that correspond to various laser wavelengths. Examples of laser wavelengths used for optical communication include 850 nm, 980 nm, 1060 nm, 1310 nm and 1550 nm, and, in particular, laser wavelengths between 980 nm and 1060 nm are preferably used for VCSEL 1 of the present invention.

TABLE 1

| Well layer | Barrier layer | Laser wavelength (nm) |
|---|---|---|
| GaAs | GaAlAs | 850 |
| GaInAs | GaAlAs | |
| GaInAs | GaAs | 980-1060 |
| GaInAs | GaAlAs | |
| GaInAs | GaAsP | |
| GaInAsP | GaInAsP | 1310-1550 |
| GaInAs | GaInAsP | |

Active layer 4 is interposed between a pair of spacer layers 12a, 12b. Spacer layers 12a, 12b are formed of a composition that includes Al, Ga and As, and the specific composition may be determined in accordance with the material and composition of active layer 4. The thicknesses of spacer layers 12a, 12b are determined such that the sum of the optical thicknesses of spacer layer 12a, active layer 4 and spacer layer 12b is equal to one wavelength. That is, bottom DBR mirror 3 and top DBR mirror 5 are spaced apart from each other by a distance that is equal to one-wavelength optical thickness. Spacer layers 12a, 12b preferably have the same thickness.

The lowermost layer of top DBR mirror 5 that faces spacer layer 12b is current limiting layer 15. Current limiting layer 15 has an inner portion (electrically conductive layer 15a) formed of AlAs and an outer portion (insulating layer 15b) formed of $Al_2O_3$. The inner portion, made of AlAs, forms an electrically conductive circular portion or electrically conductive circular aperture 15a. The electrically conductive portion or electrically conductive aperture 15a limits the path for the drive current for oscillating laser light and thereby reduces power consumption.

Anode electrode 9 and cathode electrode 8 are provided on the upper surface of top DBR mirror 5 (more precisely, on the upper surface of peripheral region 14a described later) and on the back surface of substrate 2, respectively. Anode electrode pad 12 is connected to Anode electrode 9. When a drive current is applied to semiconductor multilayer film 20 through the electrode pad and the electrodes, laser light is generated in active layer 4. Laser light L is amplified while it is reflected at each interface between the high refractive index layer and the low refractive index layer of top DBR mirror 5 and bottom DBR mirror 3, and is emitted from the upper surface (laser light emitting surface 17) of top DBR mirror 5.

Protective film 6 that covers top DBR mirror 5 is provided on the upper surface (laser light emitting surface 17) of top DBR mirror 5. Protective film 6 allows laser light L emitted from top DBR mirror 5 to pass therethrough. Accordingly, protective film 6 forms light emitting part 10 of VCSEL 1 together with top DBR mirror 5. Protective film 6 is formed of a dielectric material, such as SiON or SiN, and has a stepped shape that conforms to the shape of top high refractive index layer 14 and that projects in direction D in which the laser light is emitted. Protective film 6 preferably has a constant optical thickness i.e., a product of the film thickness and the refractive index of protective film 6, and more preferably an optical thickness of $(1/2)\lambda$ ($\lambda$ is the wavelength of laser light in vacuum), regardless of the radial positions.

The portion of semiconductor multilayer film 20 from top DBR mirror 5 to the intermediate part of bottom DBR mirror 3 is formed into mesa structure 11 that protrudes in direction D in which the laser light is emitted, i.e., into a projecting or mountain-like shape. The upper surface of bottom DBR mirror 3 positioned around mesa structure 11 and the side surfaces of mesa structure 11 are covered with insulating layer 7 that is made of insulating material such as SiN.

Top high refractive index layer 14 has central region 14b and peripheral region 14a positioned around central region 14b. Central region 14b includes projected point 14d on top high refractive index layer 14. Projected point 14d is obtained by projecting center point 15c of electrically conductive aperture 15a of current limiting layer 15 onto top high refractive index layer 14 in direction P in which the layers of semiconductor multilayer film 20 or top DBR mirror 5 are stacked. Top high refractive index layer 14 has a generally circular planar shape. Central region 14b has a circular shape that is concentric with top high refractive index layer 14. Preferably, center axis 14e of central region 14b passes through projected point 14d on top high refractive index layer 14. Central region 14b of top high refractive index layer 14 has protrusion 14c that projects relative to peripheral region 14a in direction D in which the laser light is emitted.

The VCSEL 1 satisfies the relationships below;

$$dp \times n = (1/4 + N/2) \times \lambda, \text{ and}$$

$$dc \times n = dp \times n + (1/4 + M/2) \times \lambda$$

where
$\lambda$ is the wavelength of the laser light in vacuum;
dc is the film thickness of top high refractive index layer 14 in central region 14b;
dp is the film thickness of top high refractive index layer 14 in peripheral region 14a;
n is the refractive index of top high refractive index layer 14; and
N and M are zero or a natural number.

FIG. 4 shows a typical arrangement in which the optical thickness $dc \times n$ of central region 14b is $(1/2)\lambda$ and the optical thickness $dp \times n$ of peripheral region 14a is $(1/4)\lambda$. In one example where the oscillation wavelength of the laser is 850 nm, the actual thickness dp of peripheral region 14a is 61 nm, which corresponds to $dp \times n = (1/4)\lambda$, and the actual thickness dc of central region 14b is 122 nm, which corresponds to $dc \times n = (1/2)\lambda$.

Figure 5:
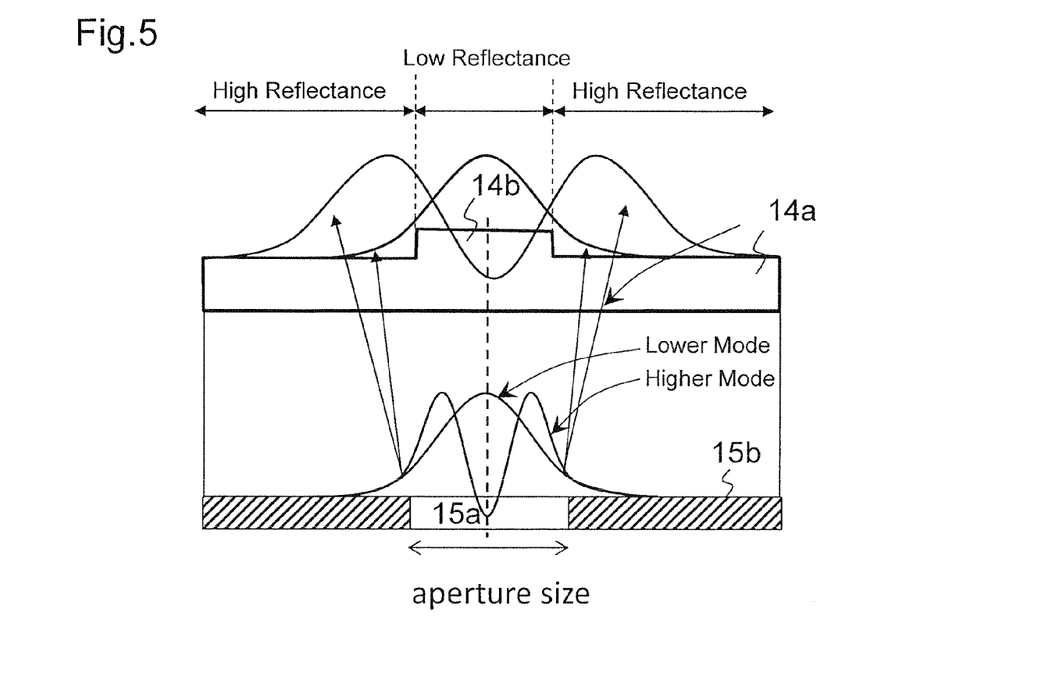
FIG. 5 is a schematic diagram showing the difference between the reflectance ratio at the central region and the reflectance ratio at the peripheral region in the top DBR mirror shown in FIG. 4.

The optical thickness $dp \times n$ of peripheral region 14a is $(1/4 + N/2) \times \lambda$, i.e., 1/4 wavelength, 3/4 wavelength, 5/4 wavelength and so on of the laser light. Therefore, the phase of the laser light passing through peripheral region 14a matches the other high refractive index layers 5a and low refractive index layers 5b of top DBR mirror 5, and the reflectance ratio of the entire top distributed Bragg reflecting mirror is increased, as shown in FIG. 5. On the other hand, the optical thickness $dc \times n$ of central region 14b is larger than the optical thickness $dp \times n$ of peripheral region 14a by $(1/4 + M/2) \times \lambda$. That is, the optical thickness $dc \times n$ of central region 14b corresponds to the multiple of 1/2 wavelength of laser light. Therefore, the phase of the laser light passing through central region 14b does not match the other high refractive index layers 5a and low refractive index layers 5b of top DBR mirror 5. The reflectance ratio of the entire top distributed Bragg reflecting mirror is reduced so that laser oscillation is limited and the intensity of light is reduced, as shown in FIG. 5.

Figure 6A:
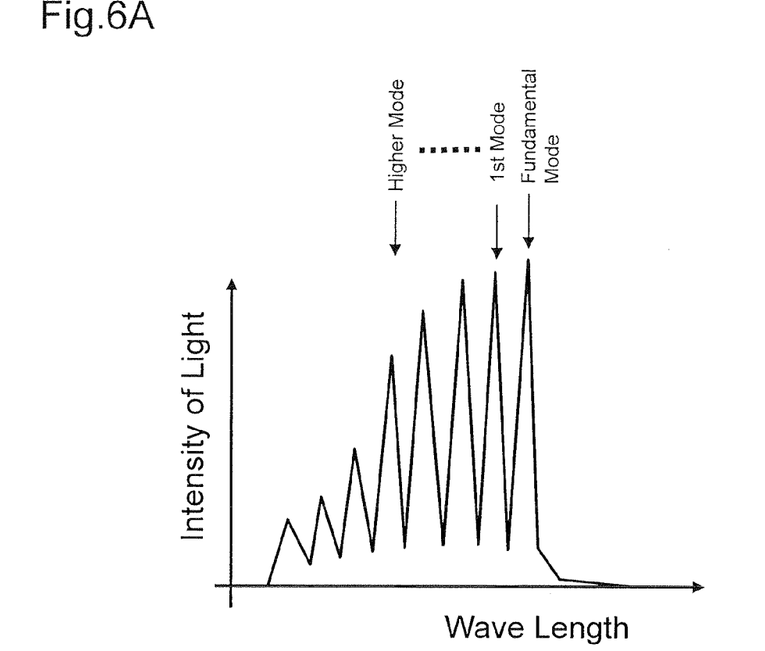
FIGS. 6A and 6B are schematic diagrams showing the light intensity of various modes according to prior art and the present invention, respectively.
Figure 6B:
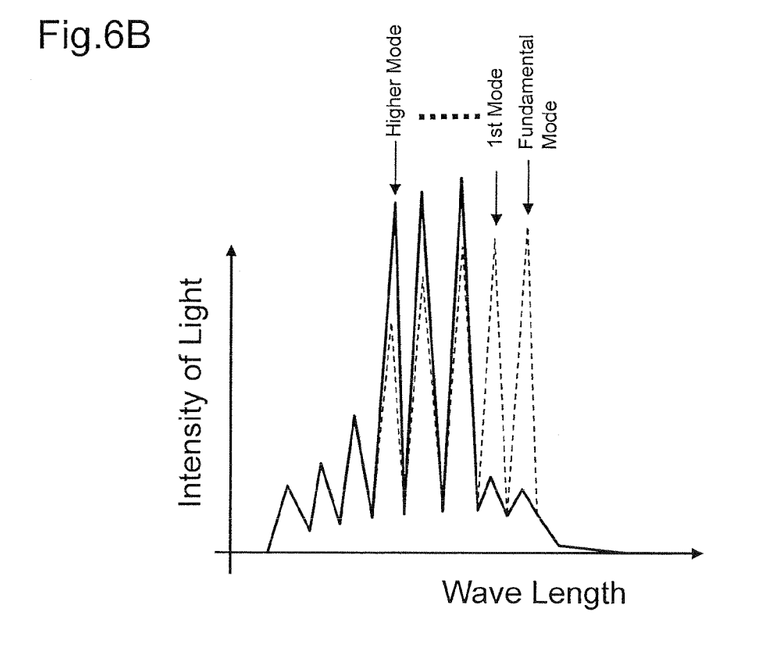

Laser light emitted from VCSEL 1 includes a plurality of transverse modes. Lower modes, such as the fundamental mode and the first mode, have high electric field intensity at the central portion of light emitting part 10 of VCSEL 1, while higher modes have high electric field intensity at the peripheral portion of light emitting part 10. In a conventional VCSEL, lower modes tend to dominate (FIG. 6A) because the high refractive index layers and the low refractive index layers have constant film thicknesses (that is, the refractive-index is constant irrespective of the radial positions of the high refractive index layers and the low refractive index layers) and because higher modes can be easily affected by the scattered light at the inner periphery of insulating layer 15b in current limiting layer 15. In the present invention, however, the laser light is amplified more efficiently at peripheral region 14a of top high refractive index layer 14 of VCSEL 1 because the reflectance ratio is higher at the peripheral portion of light emitting part 10, which corresponds to peripheral region 14a of top high refractive index layer 14, while the reflectance ratio is lower at the central portion of light emitting part 10, which corresponds to central region 14b of top high refractive index layer 14. As a result, oscillation of lower modes is limited while oscillation of higher modes is promoted (FIG. 6B).

Further, since central region 14b has the protrusion and a lower reflectance ratio at central region 14b while peripheral region 14a has a higher reflectance ratio, emitting angle θ of laser light L emitted from top high refractive index layer 14 can be reduced due to an optical effect that is similar to that of a convex lens. As a result, laser light L can be easily collected (less likely to be diffused), coupling loss with an optical fiber can be reduced and transmission performance (velocity and distance) can be improved. In a preferred embodiment, the optical thickness $dp \times n$ of peripheral region 14a is $(1/4)\lambda$ and the optical thickness $dc \times n$ of central region 14b is $(1/2)\lambda$ or $\lambda$. Laser light can be collected more effectively by reducing the optical thickness of peripheral region 14a, as described above. If optical thickness $dc \times n$ of central region 14b is equal to or larger than $(3/2)\lambda$ and optical thickness $dp \times n$ of peripheral region 14a is $(1/4)\lambda$, then central region 14b may not be formed properly.

Figure 7:
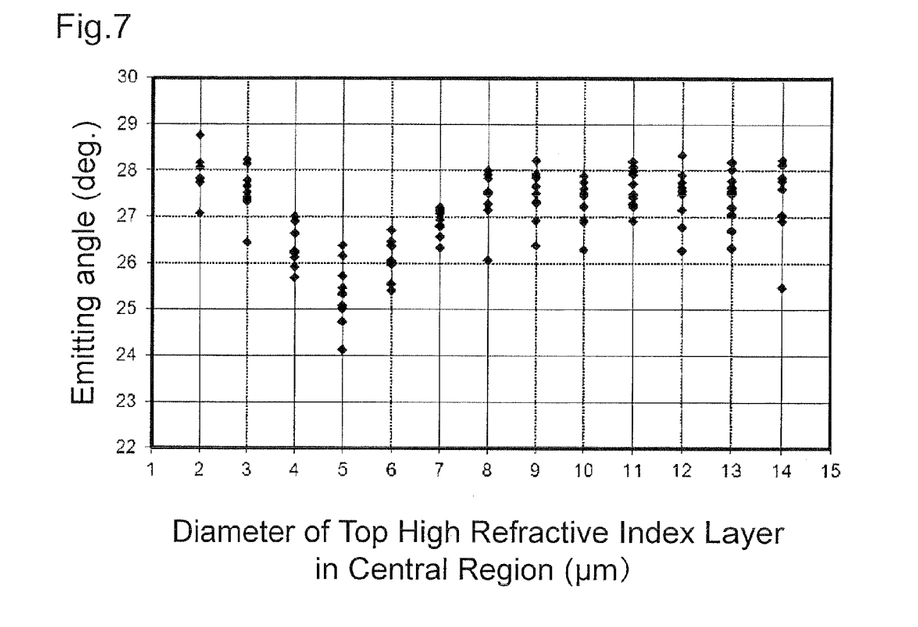
FIG. 7 is a diagram showing the relationship between the diameter of the central region of the top DBR mirror and the light emitting angle.

Emitting angle θ also depends on the ratio of diameter d1 of electrically conductive aperture 15a and diameter d2 (lens diameter) of central region 14b. FIG. 7 shows emitting angle θ that is experimentally obtained when diameter d1 of electrically conductive aperture 15a is 5.88 μm and when diameter d2 of central region 14b is changed as a parameter. Emitting angle θ decreases in the range from 4 to 7 μm (d2/d1=68 to 119%) and increases at 3 μm (d2/d1=51%) and 8 μm (d2/d1=136%). Therefore, it is desirable that central region 14b have diameter d2 that ranges from 60% to 120% of diameter d1 of electrically conductive aperture 15a. Diameter d2 of central region 14b is 1.8 μm at minimum and 14.4 μm at maximum because diameter d1 of electrically conductive aperture 15a is generally 3 to 12 μm.

Figure 8A:
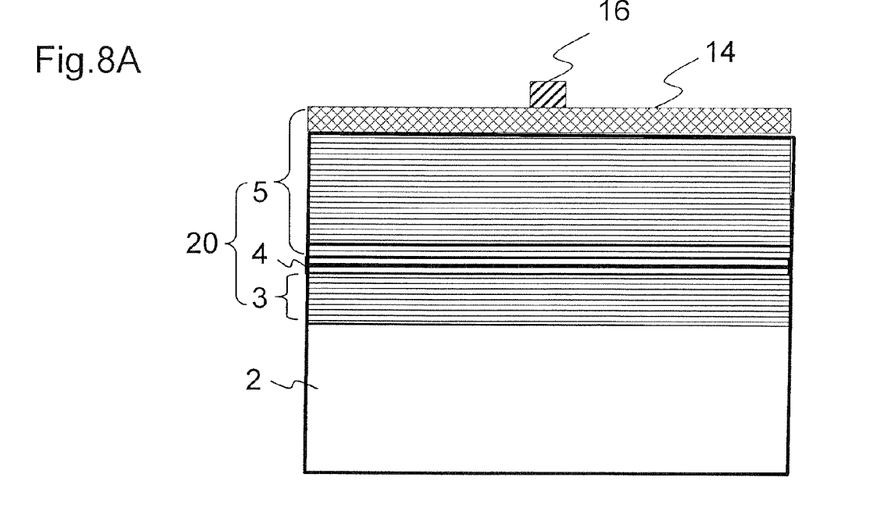
FIGS. 8A to 8F are step diagrams showing a method of manufacturing the VCSEL of the present invention.

A method of manufacturing VCSEL 1 of the present invention will be now described. First, n-type multilayer film 3 (a multilayer film in which n-type $Ga_{0.1}Al_{0.9}As$ layers and n-type $Ga_{0.9}Al_{0.1}As$ layers are alternately stacked), which is to be the bottom DBR mirror, GaAs layer 4, which is to be the active layer, and p-type multilayer film 5 (a multilayer film in which p-type $Ga_{0.1}Al_{0.9}As$ layers and p-type $Ga_{0.9}Al_{0.1}As$ layers are alternately stacked), which is to be the top DBR mirror, are successively formed on n-type GaAs substrate 2, as shown in FIG. 8A. The uppermost layer of p-type multilayer film 5, i.e., top high refractive index layer 14 is formed such that it has an optical thickness of $(1/2+M/2)\times\lambda$, preferably $(1/2)\lambda$, where M is equal to zero or a natural number. Semiconductor multilayer film 20, consisting of the n-type and p-type multilayer films and the active layer, is formed by means of metal organic chemical vapor deposition (MOCVD). Subsequently, resist mask 16 that covers p-type multilayer film 5 is formed. The diameter of resist mask 16 is, for example, 6 μm.

Figure 8B:
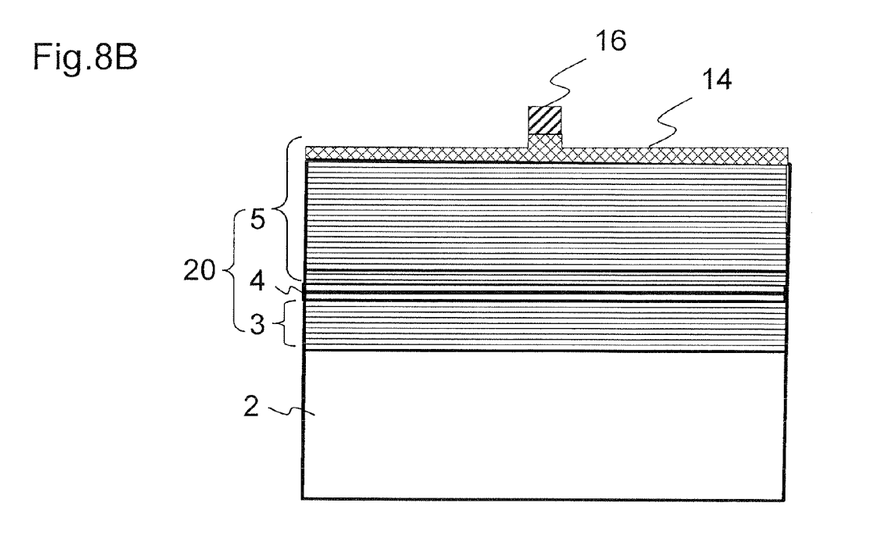

Next, as shown in FIG. 8B, part of top high refractive index layer 14, except the region covered with resist mask 16, is removed by means of etching in order to form protrusive top high refractive index layer 14 having central region 14b and peripheral region 14a. The optical thickness $dc \times n$ of central region 14b is not changed by the etching, while the optical thickness $dp \times n$ of peripheral region 14a becomes $(1/4+N/2)\times\lambda$, where N is equal to zero or a natural number. When the optical thickness $dc \times n$ of central region 14b is $(1/2)\lambda$, the optical thickness $dp \times n$ of peripheral region 14a is $(1/4)\lambda$.

Figure 8C:
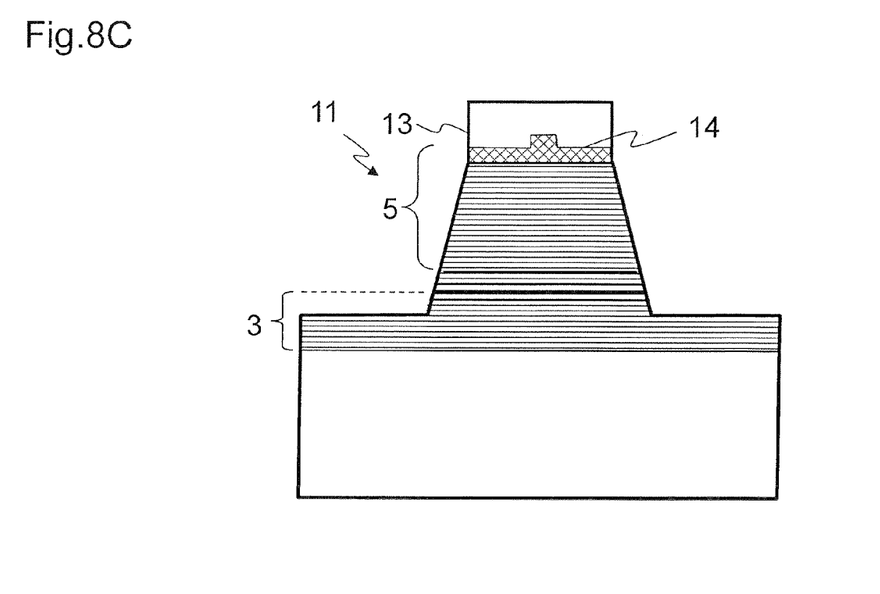

Next, as shown in FIG. 8C, mesa forming mask 13 is provided at the center of top high refractive index layer 14, and a multilayer film (top DBR mirror 5, active layer 4 and bottom DBR mirror 3) in mesa structure 11 is formed by means of etching. Mesa forming mask 13 is formed of a dielectric material and has a diameter of, for example, 25 μm. N-type multilayer film 3 is only partially removed with regard to the thickness direction. Reactive ion etching (RIE) is used for the etching process.

Figure 8D:
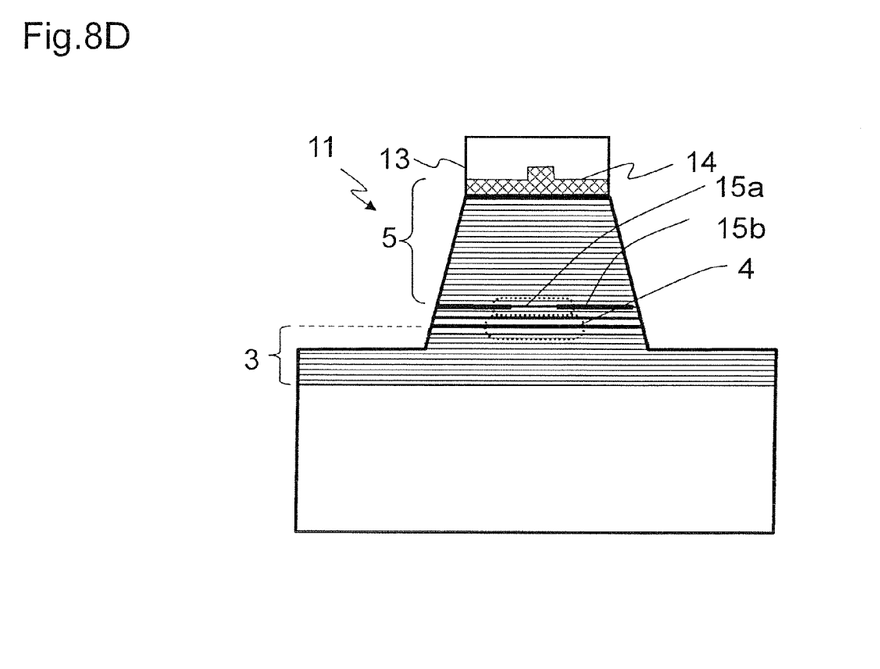

Next, as shown in FIG. 8D, an oxidation process is carried out by the steam oxidation method. The outer peripheral portion of the AlAs layer, which forms the lowermost layer of p-type multilayer film 5, is oxidized by the steam oxidation method so that it is chemically changed into aluminum oxide ($Al_2O_3$) layer (insulating layer 15b), which is an electrically insulating material. Steam oxidation progresses with time from the side walls of mesa structure 11 toward inside thereof. Therefore, it is possible to change the outer peripheral portion of the AlAs layer into aluminum oxide (insulating layer 15b) while keeping the central portion in the state of the AlAs layer (electrically conductive aperture 15a made of semiconductor) by adjusting the time duration of the steam oxidation process. Concentrated injection of a current into active layer 4 is thus achieved. Mesa forming mask 13 is maintained (not removed) during the process.

Figure 8E:
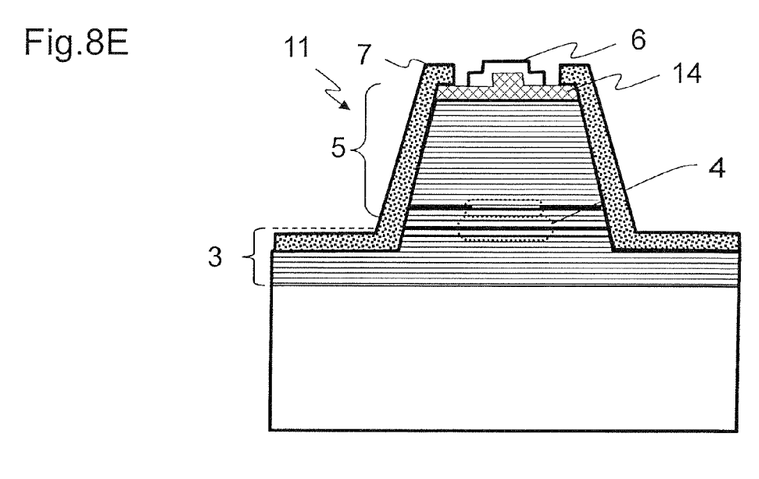

Next, as shown in FIG. 8E, insulating layer 7, made of a dielectric material, is deposited (formed) on the top of mesa structure 11 (the top of mesa forming mask 13) and on the side walls of mesa structure 11. Insulating layer 7 is formed of SiN, similarly to mesa forming mask 13. Subsequently, a part of insulating layer 7 on the top of mesa structure 11 (e.g., a circular region having a diameter of 20 μm) is removed by etching. Mesa forming mask 13 is simultaneously removed in the process. RIE is used for the etching process.

Next, as shown in FIG. 8E, protective film 6 that covers top high refractive index layer 14 is formed. Since top high refractive index layer 14 is formed in a stepped shape, protective film 6 is also formed in a stepped shape. Protective film 6, which is formed of a dielectric film such as SiON, is formed into a cylindrical shape. Protective film 6 is formed in a smaller diameter (e.g., a diameter of 12 μm) than insulating layer 7 so that top high refractive index layer 14 is exposed on the top of mesa structure 11.

Figure 8F:
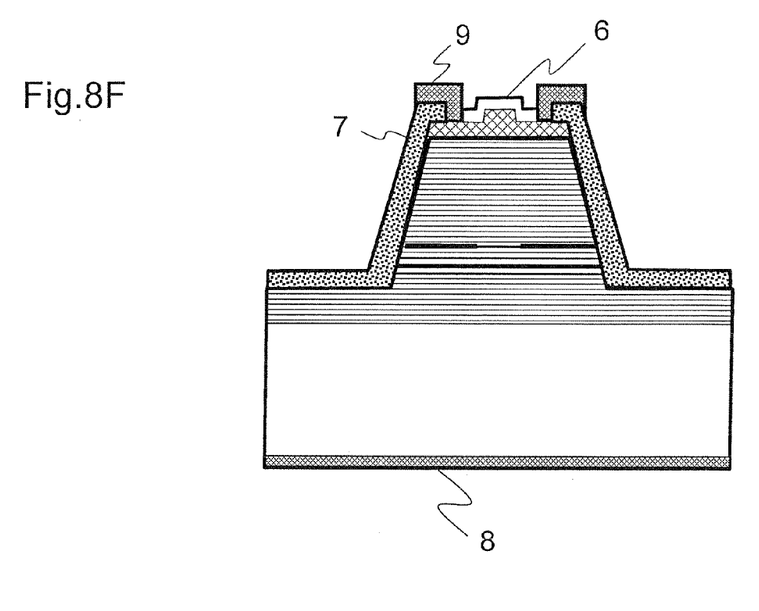

Next, as shown in FIG. 8F, anode electrode 9 and cathode electrode 8 are formed on the region on the top of mesa structure 11 where top high refractive index layer 14 is exposed and on the back surface of substrate 2, respectively, by means of vapor deposition. Anode electrode 9 is a two-layer film formed of Ti (10 nm thick) and Au (300 nm thick). Cathode electrode 8 is a two-layer film formed of Ti (10 nm thick) and AuGe (300 nm thick). The Ti/Au layer formed on protective film 6 is removed by liftoff or etching in order to form light emitting part 10 (having a diameter of, for example, 12 μm). Thereafter, anode electrode pad 12 (see FIG. 3) connected to anode electrode 9 is formed.

Several preferred embodiments of the present invention have been described in detail. However, it is to be understood that various changes and modifications can be made in the described embodiments without departing from the gist or the scope of the appended claims.

What is claimed is:

1. A vertical cavity surface emitting semiconductor laser (VCSEL) comprising a bottom distributed Bragg reflecting mirror, a top distributed Bragg reflecting mirror and an active layer that is used to generate laser light and that is positioned between the bottom distributed Bragg reflecting mirror and the top distributed Bragg reflecting mirror, the laser light being emitted from the top distributed Bragg reflecting mirror, wherein the top distributed Bragg reflecting mirror includes high refractive index layers and low refractive index layers that are alternately stacked, one of the high refractive index layers being a top high refractive index layer positioned at a laser light emitting surface of the top distributed Bragg reflecting mirror, wherein the top high refractive index layer has a central region and a peripheral region, the central region including a projected point located on the top high refractive index layer, the projected point being obtained by projecting a center point in the active layer onto the top distributed Bragg reflecting mirror in a direction in which layers of the top distributed Bragg reflecting mirror are stacked, and the peripheral region being positioned around the central region, wherein the central region has a protrusion that projects relative to the peripheral region in a direction in which the laser light is emitted, wherein the VCSEL satisfies relationships below:

$$dp \times n = (1/4+N/2)\times\lambda, \text{ and}$$

$$dc \times n = dp \times n + (1/4+M/2)\times\lambda$$

where

λ is a wavelength of the laser light in vacuum;

dc is a film thickness of the top high refractive index layer in the central region;

dp is a film thickness of the top high refractive index layer in the peripheral region;

n is a refractive index of the top high refractive index layer; and

N and M are zero or a natural number.

2. The vertical cavity surface emitting semiconductor laser according to claim 1, wherein dp×n of the peripheral region is $(1/4)\lambda$, and dc×n of the central region is $(1/2)\lambda$ or $\lambda$.

3. The vertical cavity surface emitting semiconductor laser according to claim 1, wherein the top distributed Bragg reflecting mirror has a current limiting layer at an end surface that faces the active layer, the current limiting layer including an electrically conductive circular aperture that limits a path for a drive current that generates the laser light, the central region having a diameter ranging from 60% to 120% of a diameter of the electrically conductive aperture.

4. The vertical cavity surface emitting semiconductor laser according to claim 1, further comprising a protective film that covers the top distributed Bragg reflecting mirror, the protective film having a constant film thickness.

5. The vertical cavity surface emitting semiconductor laser according to claim 4, wherein a product of the film thickness of the protective film and the refractive index of the protective film is $(1/2)\lambda$.

* * * * *